US011522097B2

(12) United States Patent
Lim et al.

(10) Patent No.: US 11,522,097 B2
(45) Date of Patent: Dec. 6, 2022

(54) DIODE DEVICES AND METHODS OF FORMING DIODE DEVICES

(71) Applicant: GLOBALFOUNDRIES Singapore Pte. Ltd., Singapore (SG)

(72) Inventors: Khee Yong Lim, Singapore (SG); Kiok Boone Elgin Quek, Singapore (SG); Sandipta Roy, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 170 days.

(21) Appl. No.: 17/069,900

(22) Filed: Oct. 14, 2020

(65) Prior Publication Data

US 2022/0115552 A1   Apr. 14, 2022

(51) Int. Cl.
  *H01L 31/107*  (2006.01)
  *H01L 31/18*   (2006.01)
  *H01L 31/0352* (2006.01)

(52) U.S. Cl.
  CPC .... *H01L 31/107* (2013.01); *H01L 31/035272* (2013.01); *H01L 31/18* (2013.01)

(58) Field of Classification Search
  CPC ........... H01L 31/107; H01L 31/035272; H01L 31/18
  See application file for complete search history.

(56) References Cited

U.S. PATENT DOCUMENTS

| 10,283,664 | B2  | 5/2019  | Stark |
| 2010/0127314 | A1 | 5/2010 | Frach |
| 2012/0205731 | A1* | 8/2012 | Henderson ............ H01L 31/107 257/E27.122 |
| 2019/0312170 | A1 | 10/2019 | Roy |

FOREIGN PATENT DOCUMENTS

| CN | 103872168 A | * | 6/2014 | |
| CN | 110246903 A | * | 9/2019 | ....... H01L 31/02027 |

OTHER PUBLICATIONS

Feng et al., "Graphene based Schottky junction solar cells on patterned silicon-pillar-array substrate", Applied Physics Letters, 2011, 5 pages, vol. 99, American Institute of Physics.
Nieuwenhove et al., "Novel Standard CMOS Detector using Majority Current for guiding Photo-Generated Electrons towards Detecting Junctions", Proceedings Symposium IEEE/LEOS Benelux Chapter, 2005, pp. 229-232.

* cited by examiner

*Primary Examiner* — Sitaramarao S Yechuri
(74) *Attorney, Agent, or Firm* — Viering Jentschura & Partner MBB

(57) ABSTRACT

A diode device may be provided, including a semiconductor substrate including a well region arranged therein, a first doped region and a second doped region arranged within the well region, a first contact region arranged within the first doped region, and an isolation structure arranged within the first doped region, where an oxide layer may line a surface of the isolation structure. The first doped region and the first contact region may have a first conductivity type, and the well region and the second doped region may have a second conductivity type different from the first conductivity type. A doping concentration of the first contact region may be higher than a doping concentration of the first doped region, and a part of the first doped region may be arranged between the first contact region and the well region.

19 Claims, 9 Drawing Sheets

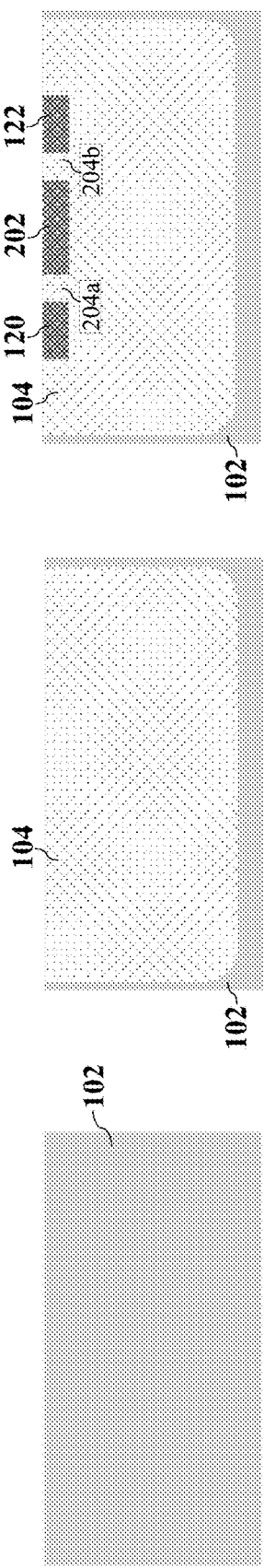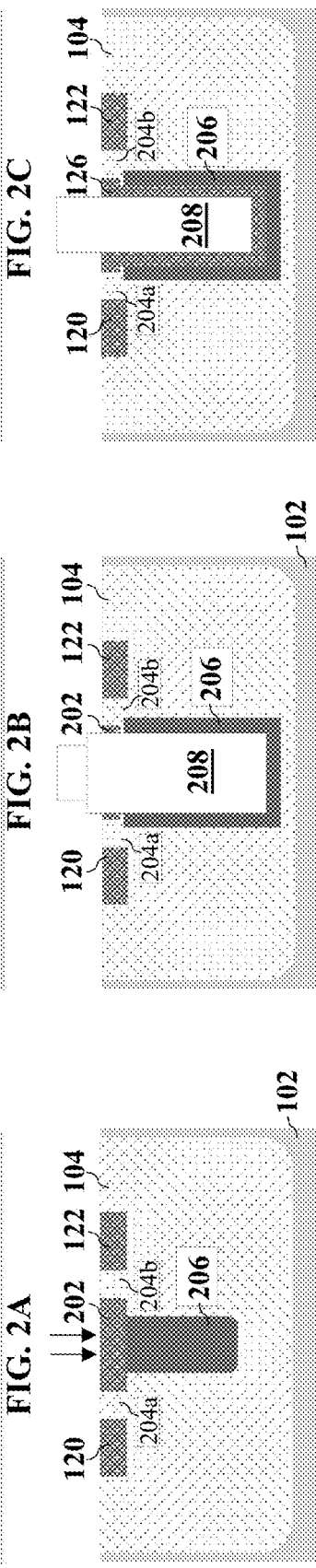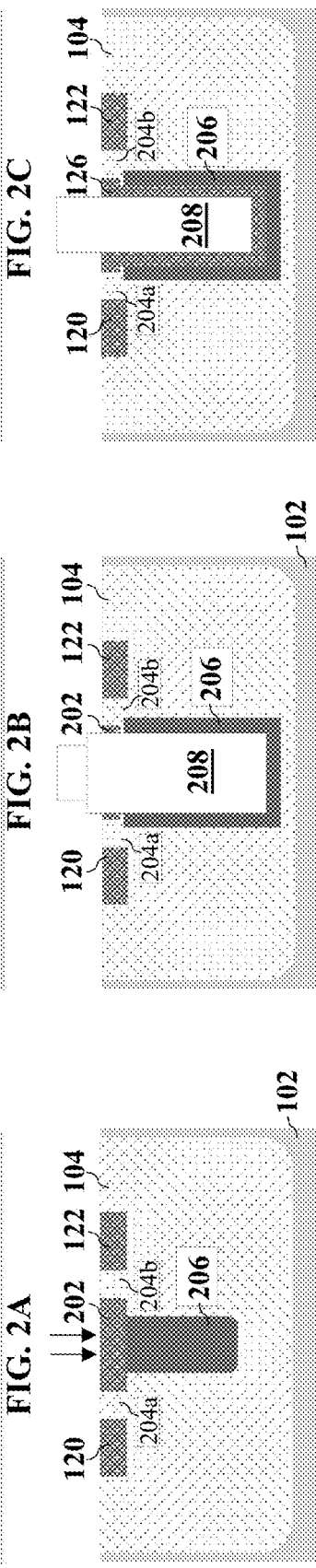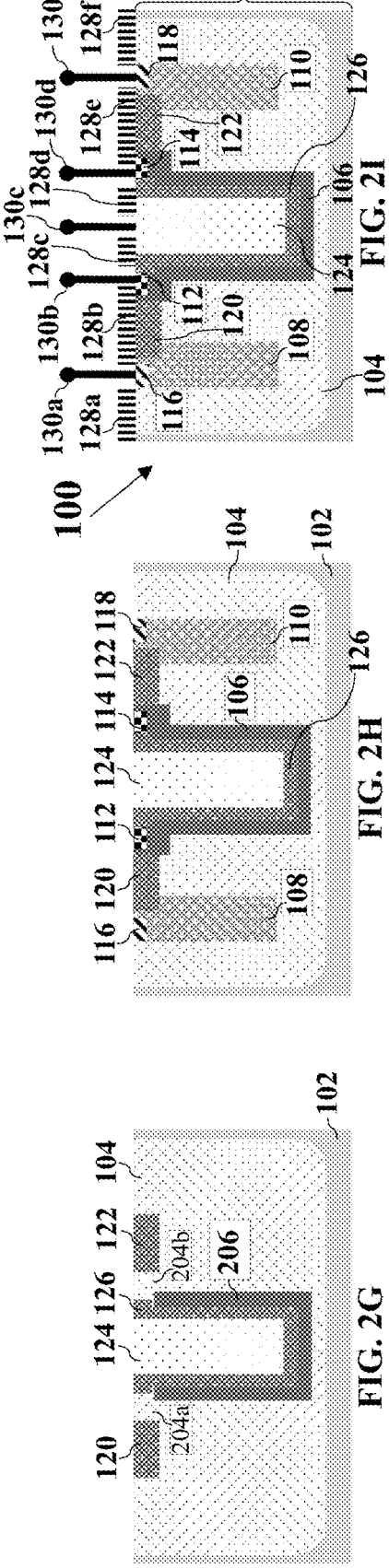

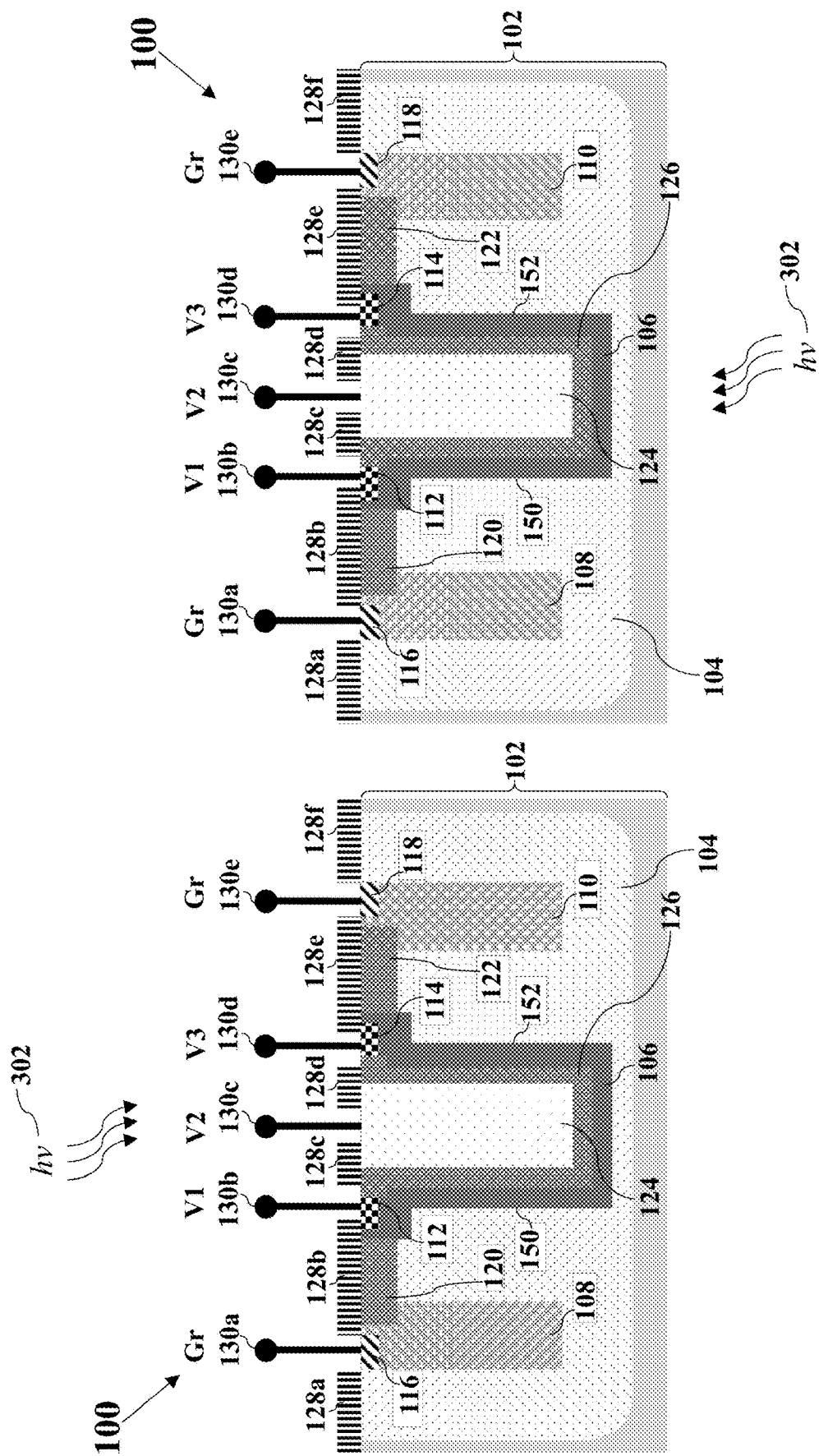

DIODE DEVICES AND METHODS OF FORMING DIODE DEVICES

TECHNICAL FIELD

The present disclosure relates generally to diode devices, and methods of forming the diode devices.

BACKGROUND

Diode devices, such as avalanche photodiodes, are often used as image sensors. A typical diode device includes a P-type semiconductor material and an N-type semiconductor material arranged beside each other to form a PN junction. In operation, the PN junction is reverse biased. When light is incident onto the diode device, photons are absorbed in a depletion region across the PN junction. This produces a detection current proportional to the intensity of the light incident onto the diode device.

Due to the abrupt PN junctions, current diode devices generally have high dark count rates. Further, premature edge oxide breakdown often occur in current diode devices. These can affect the performance of the diode devices. Therefore, it is desirable to provide an improved diode device with a lower dark count rate and a reduced likelihood of premature edge oxide breakdown.

SUMMARY

According to various non-limiting embodiments, there may be provided a diode device including: a semiconductor substrate including a well region arranged therein; a first doped region and a second doped region arranged within the well region; a first contact region arranged within the first doped region, where a doping concentration of the first contact region may be higher than a doping concentration of the first doped region, and a part of the first doped region may be arranged between the first contact region and the well region; and an isolation structure arranged within the first doped region; where an oxide layer may line a surface of the isolation structure. The first doped region and the first contact region may have a first conductivity type, and the well region and the second doped region may have a second conductivity type different from the first conductivity type.

According to various non-limiting embodiments, there may be provided a method for forming a diode device, the method including: providing a semiconductor substrate; forming a well region within the semiconductor substrate; forming a first doped region and a second doped region within the well region; forming a first contact region within the first doped region, where a doping concentration of the first contact region may be higher than a doping concentration of the first doped region, and a part of the first doped region may be arranged between the first contact region and the well region; and forming an isolation structure within the first doped region and an oxide layer lining a surface of the isolation structure. The first doped region and the first contact region may have a first conductivity type, and the well region and the second doped region may have a second conductivity type different from the first conductivity type.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 2A to 2I show simplified cross-sectional views illustrating a method of forming the diode device of FIG. 1 according to various non-limiting embodiments;

FIGS. 3A and 3B show simplified cross-sectional views of the diode device of FIG. 1 in use;

DETAILED DESCRIPTION

Figure 1:
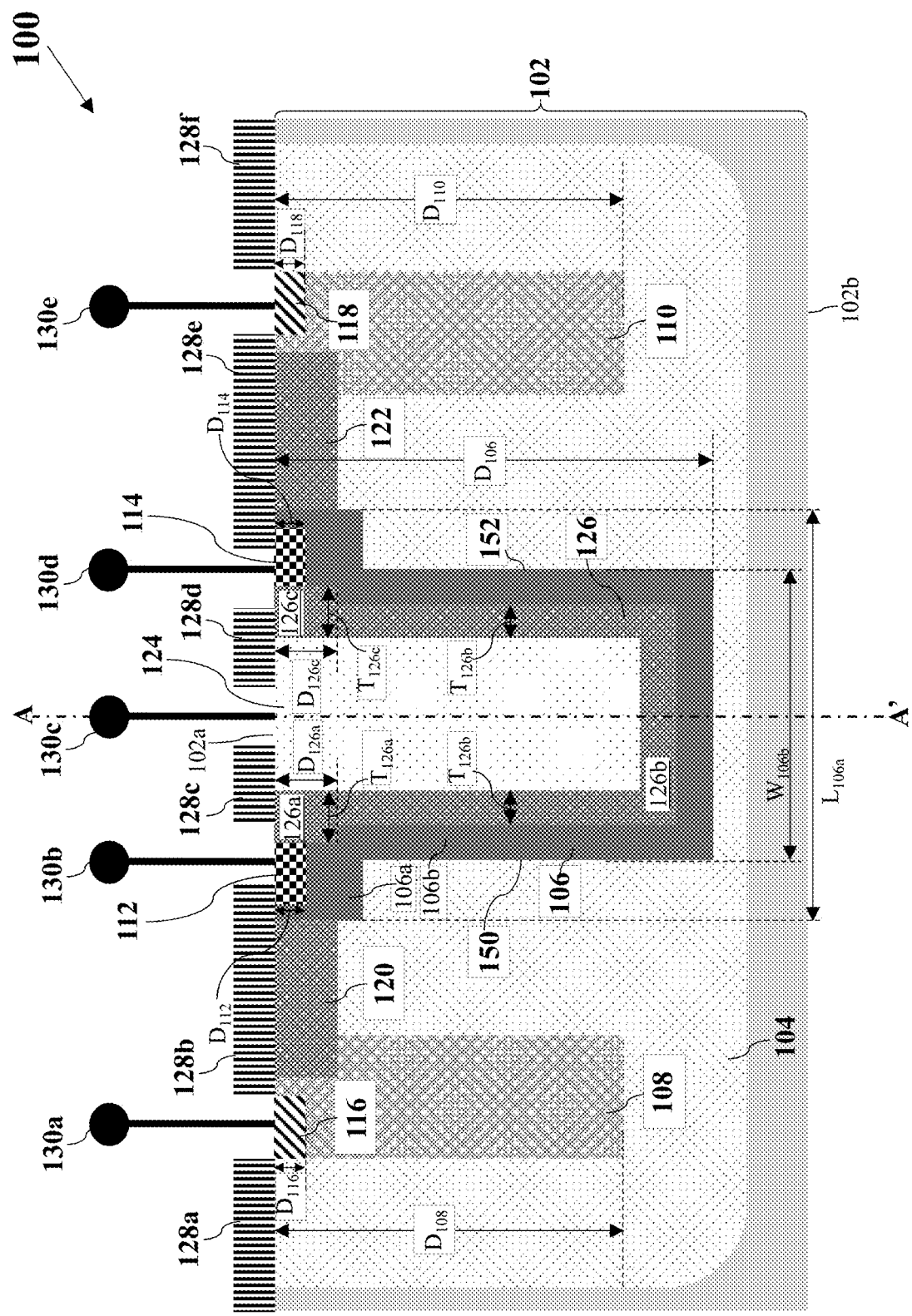
FIG. 1 shows a simplified cross-sectional view of a diode device according to various non-limiting embodiments.

The embodiments generally relate to diode devices. More particularly, some embodiments relate to avalanche photodiodes (APDs), such as single-photon avalanche diodes (SPADs). The diode devices may be used in several applications, such as, but not limited to, image sensing applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a diode device 100 according to various non-limiting embodiments. The diode device 100 may be an avalanche photodiode (APD), for example, a single-photon avalanche diode (SPAD). As shown in FIG. 1, the diode device 100 may be symmetrical about a central vertical axis A-A'.

Referring to FIG. 1, the diode device 100 may include a semiconductor substrate 102. The semiconductor substrate 102 may include silicon. For example, as shown in FIG. 1, the semiconductor substrate 102 may include bulk silicon. The semiconductor substrate 102 may include a well region 104 arranged therein.

The diode device 100 may further include a first doped region 106, a second doped region 108 and a further second doped region 110 arranged within the well region 104. The first doped region 106 may also be referred to as a sidewall region. The first doped region 106, the second doped region 108 and the further second doped region 110 may be arranged horizontally adjacent to one another, with the first doped region 106 between the second doped region 108 and the further second doped region 110. The first doped region 106 and the second doped region 108 may be spaced apart, with a part of the well region 104 arranged between them. Similarly, the first doped region 106 and the further second doped region 110 may be spaced apart, with a part of the well region 104 arranged between them. The first doped region 106, the second doped region 108 and the further second doped region 110 may be substantially horizontally aligned along a top surface 102a of the substrate 102.

The first doped region 106 may include a first segment 106a substantially horizontally aligned along the top surface 102a of the semiconductor substrate 102 and a second segment 106b arranged under the first segment 106a. The second segment 106b may be substantially perpendicular to the first segment 106a. The first segment 106a may be an elongate segment extending horizontally lengthwise along the top surface 102a of the semiconductor substrate 102; whereas, the second segment 106b may be an elongate segment extending vertically lengthwise towards a bottom surface 102b of the semiconductor substrate 102. Referring to FIG. 1, a length $L_{106a}$ of the first segment 106a may be greater than a width $W_{106b}$ of the second segment 106b. For example, the length $L_{106a}$ may range from about 2 um to about 3 um, and the width $W_{106b}$ may range from about 1 um to about 2 um.

Each of the second doped region 108 and the further second doped region 110 may be an elongate region having a substantially uniform width and extending lengthwise vertically towards the bottom surface 102b of the semiconductor substrate 102. As shown in FIG. 1, the first doped region 106 may extend further in a direction away from the top surface 102a of the semiconductor substrate 102 than the second doped region 108 and the further second doped region 110. In other words, a depth $D_{106}$ of the first doped region 106 may be greater than a depth $D_{108}$ of the second doped region 108 and a depth $D_{110}$ of the further second doped region 110. For example, the depth $D_{106}$ may range from about 5um to about 10 um; and the depths $D_{108}$, $D_{110}$ may be approximately equal and may each range from about 2 um to about 5um.

A first contact region 112 and a further first contact region 114 may be arranged within the first doped region 106 (in particular, within the first segment 106a of the first doped region 106). As shown in FIG. 1, the first contact region 112 and the well region 104 may be spaced apart, with a part of the first doped region 106 arranged between them. Similarly, the further first contact region 114 and the well region 104 may be spaced apart, with a part of the first doped region 106 arranged between them. A second contact region 116 may be arranged within the second doped region 108 and a further second contact region 118 may be arranged within the further second doped region 110. As shown in FIG. 1, the second contact region 116 may be arranged along a side of the second doped region 108, and the further second contact region 118 may be arranged along a side of the further second doped region 110, where these sides may face away from the first doped region 106. The first contact region 112, the further first contact region 114, the second contact region 116 and the further second contact region 118 may be substantially horizontally aligned along the top surface 102a of the substrate 102. The depths $D_{112}$, $D_{114}$, $D_{116}$, $D_{118}$ of the first contact region 112, the further first contact region 114, the second contact region 116 and the further second contact region 118 may be approximately equal and may each range from about 0.1 um to about 0.2 um.

Each of the semiconductor substrate 102, the well region 104, the first doped region 106, the second doped region 108, the further second doped region 110, the first contact region 112, the further first contact region 114, the second contact region 116 and the further second contact region 118 may include one or more dopants. The semiconductor substrate 102, the first doped region 106, the first contact region 112 and the further first contact region 114 may be of a first conductivity type (in other words, may include dopants having the first conductivity type). The well region 104, the second doped region 108, the further second doped region 110, the second contact region 116 and the further second contact region 118 may be of a second conductivity type (in other words, may include dopants having the second conductivity type), where the second conductivity type may be different from the first conductivity type. In an exemplary non-limiting embodiment, the first conductivity type may be P-type and the second conductivity type may be N-type. However, the first conductivity type may alternatively be N-type and the second conductivity type may alternatively be P-type. P-type dopants can for example, include, but are not limited to boron (B), indium (In), or a combination thereof, while N-type dopants can for example, include, but are not limited to, phosphorus (P), arsenic (As), antimony (Sb), or a combination thereof. Since the first doped region 106 and the well region 104 may be of different conductivity types, a first vertical PN junction 150 and a second vertical PN junction 152 may be formed. As shown in FIG. 1, the first vertical PN junction 150 may face the second doped region 108 and the second vertical PN junction 152 may face the further second doped region 110. A depletion region (not shown in FIG. 1) may be formed across each of the first and second vertical PN junctions 150, 152.

A doping concentration C112 of the first contact region 112 may be approximately equal to a doping concentration C114 of the further first contact region 114. Each of the doping concentrations C112, C114 of the first contact region 112 and the further first contact region 114 may be higher than a doping concentration C106 of the first doped region 106. The doping concentration C106 of the first doped region 106 may in turn be higher than a doping concentration C104 of the well region 104. In other words, C112≈C114>C106>C104. The doping concentrations C116, C118 of the second contact region 116 and the further second contact region 118 may be approximately equal, and the doping concentrations C108, C110 of the second doped region 108 and the further second doped region 110 may be approximately equal. The doping concentrations C116, C118 may be higher than the doping concentrations C108, C110, and the doping concentrations C108, C110 may in turn be higher than the doping concentration C104. In other words, C116≈C118>C108≈C110>C104. For example, the doping concentration C104 of the well region 104 may range from about $1 \times 10^{15}/cm^3$ to about $1 \times 10^{17}/cm^3$, the doping concentration C106 of the first doped region 106 may range from about $1 \times 10^{16}/cm^3$ to about $1 \times 10^{17}/cm^3$, each of the doping concentrations C108, C110 of the second doped region 108 and the further second doped region 110 may range from about $1 \times 10^{16}/cm^3$ to about $1 \times 10^{17}/cm^3$, each of the doping concentrations C112, C114 of the first contact region 112 and the further first contact region 114 may range from about $1 \times 10^{18}/cm^3$ to about $1 \times 10^{20}/cm^3$, and each of the doping concentrations C116, C118 of the second contact region 116 and the further second contact region 118 may range from about $1 \times 10^{18}/cm^3$ to about $1 \times 10^{20}/cm^3$.

As shown in FIG. 1, the diode device 100 may further include a first isolation element 120 arranged substantially horizontally between the first doped region 106 and the second doped region 108, and a second isolation element 122 arranged substantially horizontally between the first doped region 106 and the further second doped region 110. The first and second isolation elements 120, 122 may be substantially horizontally aligned along the top surface 102a of the semiconductor substrate 102. As shown in FIG. 1, the first isolation element 120 may contact the first doped region 106 and a part of the first doped region 106 may be arranged between the first isolation element 120 and the first contact region 112. Similarly, the second isolation element 122 may contact the first doped region 106 and a part of the first doped region 106 may be arranged between the second isolation element 122 and the further first contact region 114.

As shown in FIG. 1, the first isolation element 120 may extend partially into the second doped region 108 and the second isolation element 122 may extend partially into the further second doped region 110. Each of the first and second isolation elements 120, 122 may include isolation/electrically insulating material, such as, but not limited to, silicon oxide. For example, each of the first and second isolation elements 120, 122 may be a shallow trench isolation (STI) element.

In addition, the diode device 100 may also include an isolation structure 124 arranged within the first doped region 106. The isolation structure 124 may be arranged horizontally between the first contact region 112 and the further first contact region 114. As shown in FIG. 1, the isolation structure 124 may be an elongate structure and may extend vertically lengthwise in a direction away from the top surface 102a of the semiconductor substrate 102 towards the bottom surface 102b of the semiconductor substrate 102. For example, the isolation structure 124 may be a deep trench isolation structure and may include isolation material, such as, but not limited to, polysilicon. As mentioned above, the length $L_{106a}$ of the first segment 106a of the first doped region 106 may be greater than the width $W_{106b}$ of the second segment 106b of the first doped region 106. Accordingly, as shown in FIG. 1, the first segment 106a of the first doped region 106 may extend beyond the second segment 106b of the first doped region 106 in a direction away from the isolation structure 124.

As shown in FIG. 1, an oxide layer 126 may be arranged within the first doped region 106 and may line a surface of the isolation structure 124, where the surface may include the side(s) and the bottom of the isolation structure 124. The oxide layer 126 may include oxide material, such as, but not limited to, silicon oxide. The oxide layer 126 may be spaced apart from the well region 104, with a part of the first doped region 106 arranged between them. Referring to FIG. 1, the oxide layer 126 may include a first portion 126a, a second portion 126b and a third portion 126c. The first portion 126a and the third portion 126c may be arranged within the first segment 106a of the first doped region 106, and may be substantially horizontally aligned along the top surface 102a of the semiconductor substrate 102. The first portion 126a of the oxide layer 126 may be arranged between (and may contact) the first contact region 112 and the isolation structure 124; whereas, the third portion 126c of the oxide layer 126 may be arranged between (and may contact) the further first contact region 114 and the isolation structure 124. The second portion 126b of the oxide layer 126 may be arranged under the first portion 126a and the third portion 126c.

As shown in FIG. 1, the first portion 126a and the third portion 126c of the oxide layer 126 may extend further in a direction away from the surface of the isolation structure 124 than the second portion 126b of the oxide layer 126. In other words, a thickness $T_{126a}$ of the first portion 126a and a thickness $T_{126c}$ of the third portion 126c may be greater than a thickness $T_{126b}$ of the second portion 126b as shown in FIG. 1. For example, the thickness $T_{126a}$ and the thickness $T_{126c}$ may be approximately equal and may each range from about 200 nm to about 400 nm; whereas, the thickness $T_{126b}$ may range from about 20 nm to about 80 nm.

As shown in FIG. 1, the first portion 126a of the oxide layer 126 and the third portion 126c of the oxide layer 126 may extend further in a direction away from the top surface 102a of the semiconductor substrate 102 than the first contact region 112 and the further first contact region 114. In other words, a depth $D_{126a}$ of the first portion 126a of the oxide layer 126 and a depth $D_{126c}$ of the third portion 126c of the oxide layer 126 may be greater than a depth $D_{112}$ of the first contact region 112 and a depth $D_{114}$ of the further first contact region 114. For example, the depths $D_{126a}$, $D_{126c}$ of the first and third portions 126a, 126c of the oxide layer 126 may be approximately equal and may each range from about 0.3 um to about 0.6 um.

As shown in FIG. 1, the diode device 100 may further include a plurality of dielectric elements 128a-128f and a plurality of electrodes 130a-130e arranged over the top surface 102a of the semiconductor substrate 102. The dielectric elements 128a-128f may be spaced apart from one another and an electrode 130a-130e may be arranged within the space between each pair of adjacent dielectric elements 128a-128f. The electrodes 130a-130e may be in electrical contact with respective regions/structure 116, 112, 124, 114, 118 of the diode device 100 and may include electrically conductive material, for example metal such as, but not limited to, aluminum, copper, tungsten, alloys thereof or combinations thereof. The dielectric elements 128a-128f may include dielectric material, such as, but not limited to, oxide, nitride or combinations thereof.

FIGS. 2A to 2I show simplified cross-sectional views illustrating a method for fabricating the diode device 100 according to various non-limiting embodiments. For clarity of illustration, some reference numerals have been omitted from FIGS. 2A to 2I.

Referring to FIG. 2A, the method may include providing the semiconductor substrate 102 of the first conductivity type.

Referring to FIG. 2B, the method may further include forming the well region 104 within the semiconductor substrate 102. The well region 104 may be formed by doping a selected region within the semiconductor substrate 102 with dopants of the second conductivity type. This may be done using any method as known to one skilled in the art.

Referring to FIG. 2C, the method may further include forming the first and second isolation elements 120, 122 and an oxide element 202 horizontally between the isolation elements 120, 122, where the oxide element 202 may be similar to the first and second isolation elements 120, 122. The isolation elements 120, 122 and the oxide element 202 may be formed by etching the semiconductor substrate 102 to form openings therein, and filling the openings with isolation material. The isolation elements 120, 122 may be spaced apart from the oxide element 202, such that gap portions 204a, 204b within the well region 104 may be present between the oxide element 202 and the first and second isolation elements 120, 122.

Referring to FIGS. 2D to 2H, the method may further include forming the first doped region 106, the second doped region 108 and the further second doped region 110 within the well region 104, forming the isolation structure 124 and the oxide layer 126 within the first doped region 106, and forming the contact regions 112, 114, 116, 118.

As shown in FIG. 2D, the method may include forming an intermediate doped region 206 of the first conductivity type under the oxide element 202. The intermediate doped region 206 may be formed by doping a selected region of the semiconductor substrate 102 under the oxide element 202 using any method known to those skilled in the art. The dopants within the intermediate doped region 206 may diffuse through the well region 104, so that the intermediate doped region 206 may become larger over time and extend horizontally beyond the oxide element 202.

As shown in FIG. 2E, the oxide element 202 and the intermediate doped region 206 may be etched to form an opening 208.

As shown in FIG. 2F, an oxide liner may be formed along the interior surface of the opening 208. This oxide liner, together with the etched oxide element 202, may form the oxide layer 126. The oxide liner may be formed by oxidising the interior surface of the opening 208 but may alternatively be formed by other processes known to those skilled in the art.

As shown in FIG. 2G, isolation material may be deposited into the opening 208 to form the isolation structure 124.

As shown in FIG. 2H, the gap portions 204a, 204b within the semiconductor substrate 102 may be doped with dopants of the first conductivity type. The gap portions 204a, 204b may be doped using any process as known to those skilled in the art. As shown in FIG. 2H, the first doped region 106 including the doped gap portions 204a, 204b, and the intermediate doped region 206 may thus be formed. Further, as shown in FIG. 2H, the method may include forming the second doped region 108, the further second doped region 110, the first contact region 112, the further first contact region 114, the second contact region 116 and the further second contact region 118 by doping respective selected regions of the semiconductor substrate 102. Similarly, each of these regions 108, 110, 112, 114, 116, 118 may be doped using any process as known to those skilled in the art.

Referring to FIG. 2I, the method may further include forming the dielectric elements 128a-128f and the electrodes 130a-130e. The dielectric elements 128a-128f and the electrodes 130a-130e may be formed using a backend process as known to those skilled in the art. For example, the dielectric elements 128a-128f may be formed by depositing dielectric material over the top surface 102a of the semiconductor substrate 102 and etching the dielectric material to form the spaced apart dielectric elements 128a-128f; and the electrodes 130a-130e may be formed by depositing electrically conductive material in the spacing between each pair of adjacent dielectric elements 128a-128f.

The above described order for the method is only intended to be illustrative, and the method is not limited to the above specifically described order unless otherwise specifically stated. For example, instead of forming the intermediate doped region 206 in FIG. 2D, the oxide element 202 and a portion of the semiconductor substrate 102 under the oxide element 202 may first be etched to form an opening (using for example, a deep reactive ion-etching (DRIE) technique). Then, an oxide liner may be deposited along an interior surface of this opening to form the oxide layer 126, after which the intermediate doped region 206 may then be formed by implanting dopants through the interior surface of the opening into the semiconductor substrate 102. The dopants may be implanted using any process known to those skilled in the art, such as, but not limited to, tilted implantation.

FIGS. 3A and 3B show simplified cross-sectional views illustrating the diode device 100 in use. In particular, FIG. 3A shows the diode device 100 receiving front-side illumination, in other words, illumination received from a front-side (in particular, the top surface 102a) of the diode device 100; whereas, FIG. 3B shows the diode device 100 receiving back-side illumination, in other words, illumination received from a back-side (in particular, the bottom surface 102b) of the diode device 100.

In FIGS. 3A and 3B, the second doped region 108 and the further second doped region 110 may be of N-type and may serve as the cathodes of the diode device 100; whereas, the first doped region 106 may be of P-type and may serve as the anode of the diode device 100. In use, the electrodes 130a, 130e in electrical contact with the second contact region 116 and the further second contact region 118 may be connected to ground (Gr). The electrode 130b in electrical contact with the first contact region 112, the electrode 130c in electrical contact with the isolation structure 124 and the electrode 130d in electrical contact with the further first contact region 114 may be connected to external voltages V1, V2, V3 respectively. The external voltages V1, V2, V3 may be negative voltages, where the magnitudes of the external voltages V1, V3 may be larger than the magnitude of the external voltage V2. This may thus reverse bias the first and second vertical PN junctions 150, 152.

Referring to FIG. 3A, when a photon 302 (indicated as hv in FIG. 3A) is incident onto the diode device 100 from the front-side, the photon 302 may pass through the isolation structure 124 and the first doped region 106 to reach the depletion region across one of the vertical PN junctions 150, 152. The photon 302 may be absorbed in the depletion region to create electron-hole pairs. The free electrons may diffuse towards the second doped region 108/further second doped region 110 (cathode) and the free holes may diffuse towards the first doped region 106 (anode). Referring to FIG. 3B, when a photon 302 (indicated as hv in FIG. 3B) is incident onto the diode device 100 from the back-side, the photon 302 may pass through the semiconductor substrate 102, the well region 104 and the first doped region 106 to reach the depletion region across one of the vertical PN junctions 150, 152. Similarly, the photon 302 may be absorbed in the depletion region, and free electrons and holes may move towards the second doped region 108/further second doped region 110 (cathode) and the first doped region 106 (anode) respectively. When multiple photons from the front-side illumination/back-side illumination are incident onto the diode device 100, the electron-hole pairs created by the photons may form a detection current in the diode device 100, where this detection current may be measurable and may be proportional to the intensity of the front-side/back-side illumination incident onto the diode device 100.

It is understood that the conductivity types of the regions 106, 108, 110 may be reversed from that described above with reference to FIGS. 3A and 3B. Such a diode device 100 may operate in a similar manner as described above, but with the directions of the movements of the free electrons and free holes reversed. Further, although it is shown in FIGS. 3A and 3B that the front-side and back-side illumination may be applied to the same diode device 100, in various non-limiting embodiments, the semiconductor substrate 102 may be configured to be thinner for a diode device to be operated with back-side illumination.

By including an elongate isolation structure 124, the diode device 100 may include vertical PN junctions 150, 152. These vertical PN junctions 150, 152 may extend deeper into the semiconductor substrate 102 as compared to for example, horizontal PN junctions. Therefore, the diode device 100 may be capable of detecting illumination with longer wavelengths that may penetrate deeper into the semiconductor substrate 102. The photon detection probability (PDP) or photon detection efficiency (PDE) in the near infra-red (long wavelength) range of the diode device 100 may thus be higher. Further, the crosstalk of the diode device 100 may be reduced by including the elongate isolation structure 124.

Also, by including the second doped region 108 and the further second doped region 110 as elongate regions, the resistance of the diode device 100 within the well region 104 may be reduced. In turn, the jitter of the device 100 may be reduced and the timing response of the diode device 100 may improve.

In addition, as described above, the first contact region 112 of the diode device 100 may be arranged within the first doped region 106 (having a lower doping concentration than the first contact region 112), and a part of the first doped region 106 may be arranged between the first contact region 112 and the well region 104. In other words, the diode device 100 may include a region with a graduated doping concentration (formed from the first doped region 106 and the first contact region 112). Using such a graduated doping concentration may allow the PN junctions 150, 152 to be less abrupt and may thus reduce band to band tunnelling. In addition, including the first doped region 106 may also help move the PN junctions 150, 152 further away from the top surface 102a of the semiconductor substrate 102 and away from the isolation elements 120, 122. Thus, the diode device 100 may have a lower dark count rate (DCR).

Further, as described above, the oxide layer 126 may include a first portion 126a (between the first contact region 112 and the isolation structure 124) and a third portion 126c (between the further first contact region 114 and the isolation structure 124), where the first and third portions 126a and 126c are thicker as compared to the second portion 126b of the oxide layer 126 under them. These thicker oxide portions 126a, 126c near the more heavily doped first contact region 112 and further first contact region 114 may help to reduce oxide leakage and the likelihood of premature edge oxide breakdown.

Figure 4:
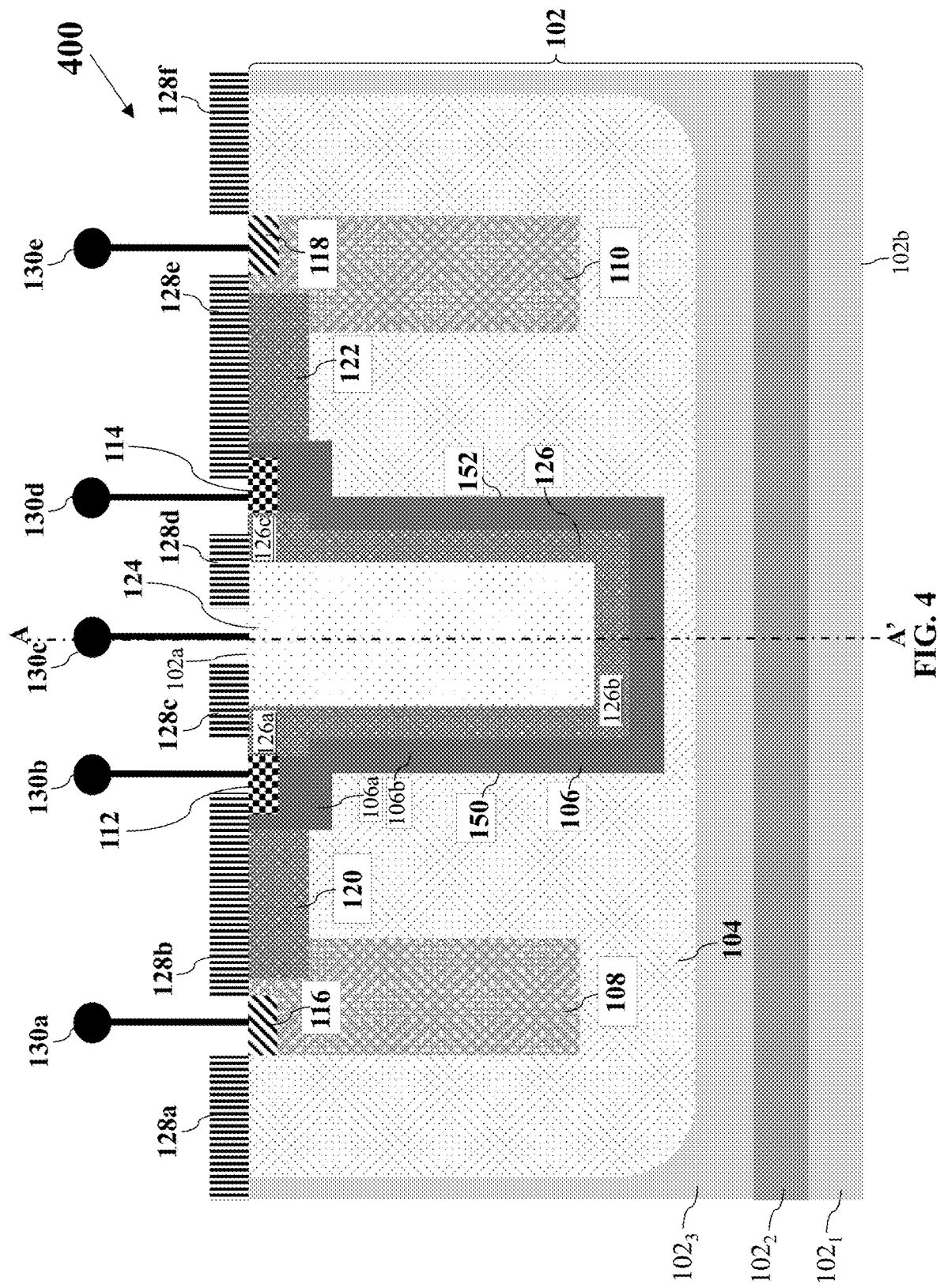
FIG. 4 shows a simplified cross-sectional view of a diode device according to alternative non-limiting embodiments.

FIG. 4 shows a simplified cross-sectional view of a diode device 400 according to alternative non-limiting embodiments. The diode device 400 may be similar to the diode device 100, and thus, the common features are labelled with the same reference numerals and need not be discussed. For clarity of illustration, some reference numerals have been omitted from FIG. 4.

As shown in FIG. 4, instead of bulk silicon, the semiconductor substrate 102 of the diode device 400 may include a silicon-on-insulator (SOI) substrate, where the SOI substrate may include a first silicon layer $102_1$, a second silicon layer $102_3$ and an insulating layer $102_2$ between the first and second silicon layers $102_1$, $102_3$. The first and second silicon layers $102_1$, $102_3$ may be of the first conductivity type. The insulating layer $102_2$ may allow illumination to pass through and may, for example, be a buried oxide layer; whereas, the second silicon layer $102_3$ may be an epitaxial layer. The diode device 400 may be fabricated in a similar manner as the fabrication of the diode device 100 as described above with reference to FIGS. 2A to 2I, except that a SOI substrate instead of bulk silicon may be provided in FIG. 2A. Similar to the diode device 100, the diode device 400 may be operated with either front-side illumination or back-side illumination.

Figure 5:
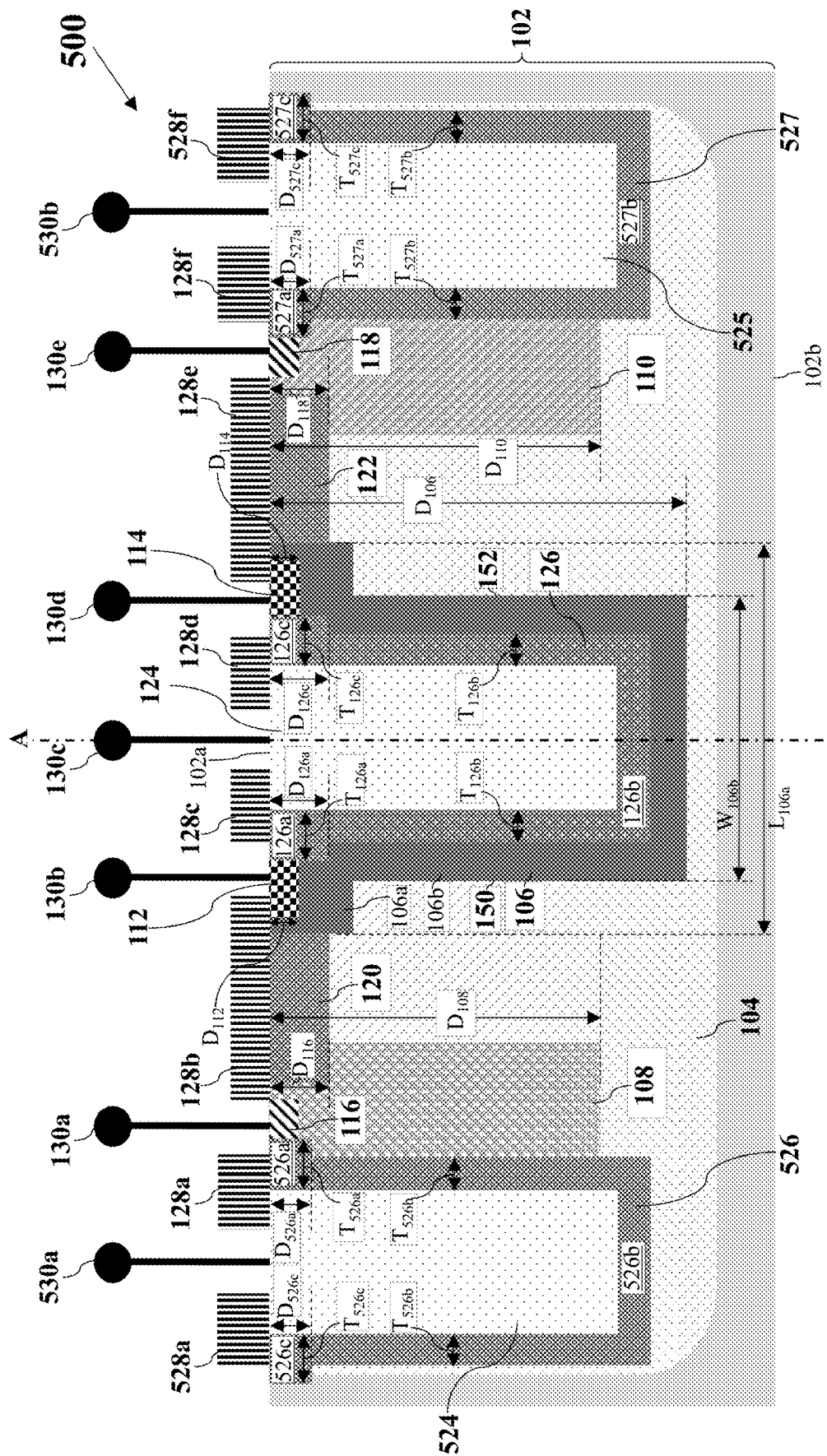
FIG. 5 shows a simplified cross-sectional view of a diode device according to alternative non-limiting embodiments.

FIG. 5 shows a simplified cross-sectional view of a diode device 500 according to alternative non-limiting embodiments. The diode device 500 may be similar to the diode device 100, and thus, the common features are labelled with the same reference numerals and need not be discussed.

As shown in FIG. 5, as compared to the diode device 100, the diode device 500 may further include a first additional isolation structure 524 and a second additional isolation structure 525. The first additional isolation structure 524 may be arranged horizontally adjacent to the second doped region 108, such that the second doped region 108 may be arranged between the first additional isolation structure 524 and the first doped region 106. Similarly, the second additional isolation structure 525 may be arranged horizontally adjacent to the further second doped region 110, such that the further second doped region 110 may be arranged between the second additional isolation structure 525 and the first doped region 106. Each additional isolation structure 524, 525 may be similar to the isolation structure 124. For example, each additional isolation structure 524, 525 may be a deep trench isolation (DTI) structure and may include isolation material, such as, but not limited to, polysilicon.

The diode device 100 may also include a first additional oxide layer 526 lining a surface of the first additional isolation structure 524, and a second additional oxide layer 527 lining a surface of the second additional isolation structure 525. The additional oxide layers 526, 527 may be similar to the oxide layer 126, and may include oxide material, such as but not limited to, silicon oxide. Each of the first additional oxide layer 526 and the second additional oxide layer 527 may include a first portion 526a, 527a, a second portion 526b, 527b and a third portion 526c, 527c. As shown in FIG. 5, the first portion 526a, 527a and the third portion 526c, 527c of each additional oxide layer 526, 527 may be substantially horizontally aligned along the top surface 102a of the semiconductor substrate 102, and the second portion 526b, 527b may be arranged under the respective first portion 526a, 527a and third portion 526c, 527c.

The first additional oxide layer 526 may contact the second doped region 108 and may extend partially into the second doped region 108. Similarly, the second additional oxide layer 527 may contact the further second doped region 110 and may extend partially into the further second doped region 110. In particular, as shown in FIG. 5, the first portion 526a of the first additional oxide layer 526 may extend partially into the second contact region 116; and the first portion 527a of the second additional oxide layer 527 may extend partially into the further second contact region 118. For each additional oxide layer 526, 527, a thickness $T_{526a}$, $T_{527a}$ of the first portion 526a, 527a may be approximately equal to a thickness $T_{526c}$, $T_{527c}$ of the third portion 526c and may be greater than a thickness $T_{526b}$, $T_{527b}$ of the second portion 526b, 527b. Further, for each additional oxide layer 526, 527, a depth $D_{526a}$, $D_{527a}$ of the first portion 526a, 527a may be approximately equal to a depth $D_{526c}$, $D_{527c}$ of the third portion 526c, 527c and may be smaller than the depths $D_{126a}$, $D_{126c}$ of the first and third portions 126a, 126c of the oxide layer 126.

As compared to the diode device 100, the diode device 500 may include additional dielectric elements 528a, 528f, and first and second additional electrodes 530a, 530b. The first additional electrode 530a may be in electrical contact with the first additional isolation structure 524 and the second additional electrode 530b may be in electrical contact with the second additional isolation structure 525. The diode device 500 may be fabricated in a similar manner as the fabrication of the diode device 100 as described above with reference to FIGS. 2A to 2I, except that further processes as known to those skilled in the art may be used to form the additional isolation structures 524, 525, the additional oxide layers 526, 527, the additional dielectric elements 528a, 528f and the additional electrodes 530a, 530b.

Figure 6:
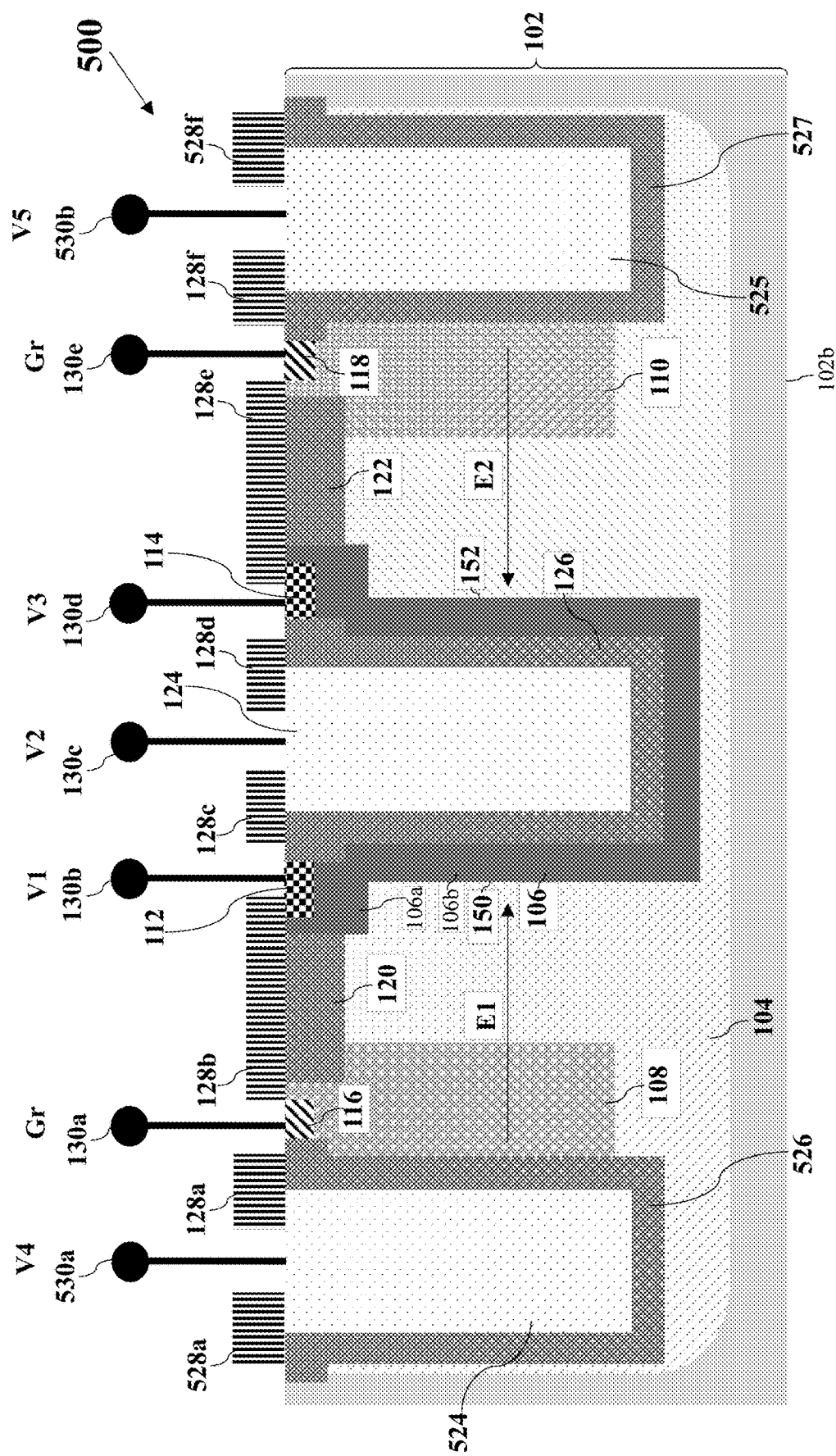
FIG. 6 shows a simplified cross-sectional view of the diode device of FIG. 5 in use.

FIG. 6 shows the diode device 500 in use. The diode device 500 may operate with front-side illumination or back-side illumination. In use, the electrodes 130a, 130e in electrical contact with the second contact region 116 and the further second contact region 118 may be connected to ground (Gr). The electrode 130b in electrical contact with the first contact region 112, the electrode 130c in electrical contact with the isolation structure 124 and the electrode 130d in electrical contact with the further first contact region 114 may be connected to external voltages V1, V2, V3 respectively. The external voltages V1, V2, V3 may be negative voltages, where the magnitudes of the external voltages V1, V3 may be larger than the magnitude of the external voltage V2. This may thus reverse bias the first and second vertical PN junctions 150, 152.

Further, the first additional electrode 530a may be connected to a first additional external voltage V4 and the second additional electrode 530b may be connected to a second additional external voltage V5. The additional external voltages V4, V5 may also be negative voltages, where the magnitudes of V4, V5 may be lower than the magnitudes of V1, V3 applied to the first doped region 106. For example, the magnitudes of V4, V5 may be approximately equal to the magnitude of V2 applied to the isolation structure 124. Accordingly, a first electric field/drift field E1 in the direction from the second doped region 108 (at a higher potential) to the first doped region 106 (at a lower potential) and a second electric field/drift field E2 in the direction from the further second doped region 110 (at a higher potential) to the first doped region 106 (at a lower potential) may be formed.

The diode device 500 may operate in a similar manner as the diode device 100, except that the electric fields E1, E2 may sweep the free holes towards the first doped region 106 (anode). Hence, the speed and signal integrity of the diode device 500 may be higher than the speed and signal integrity of the diode device 100. This may improve the response time and reduce the jitter of the diode device 500.

Figure 7A:
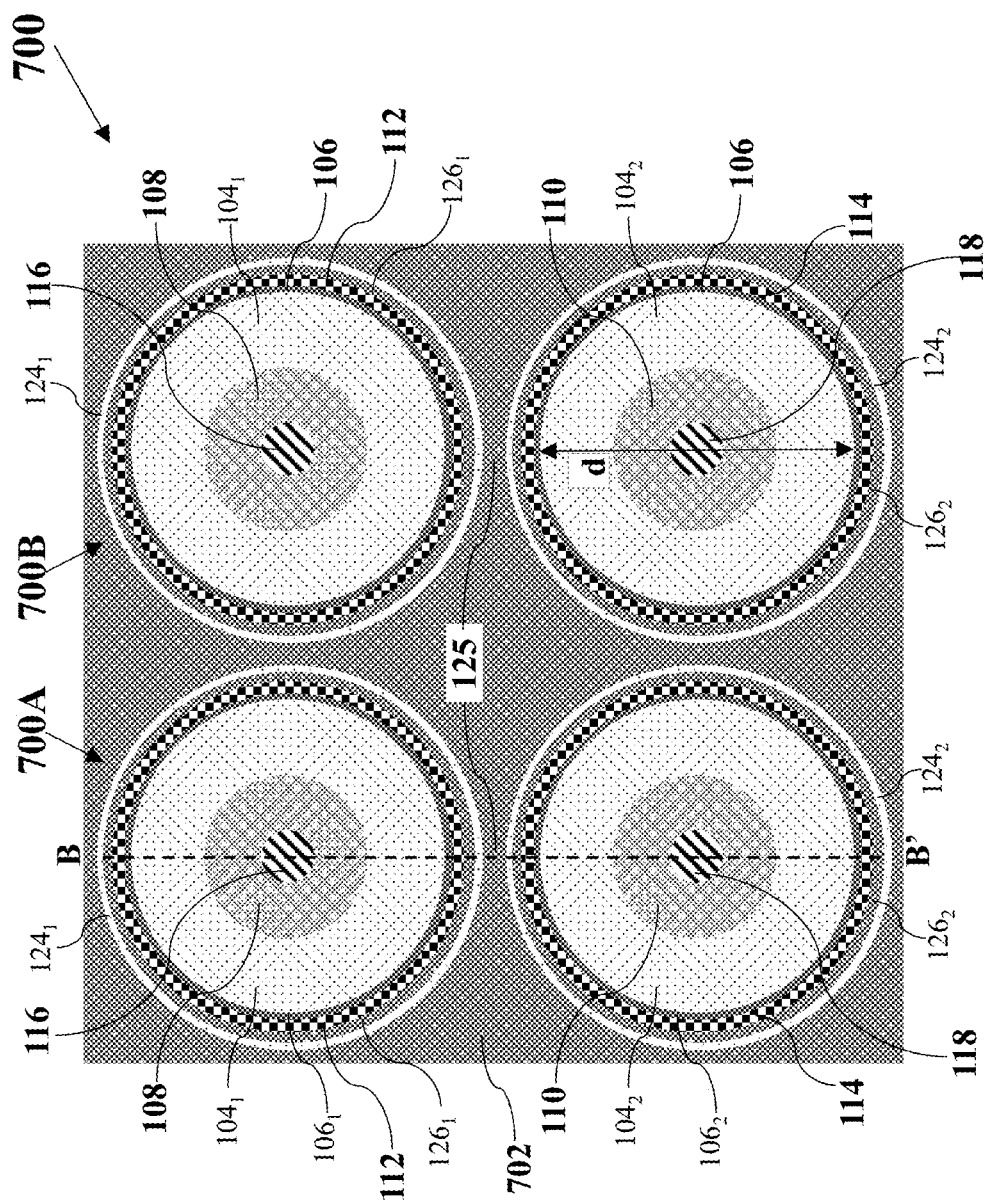
FIGS. 7A and 7B respectively show a simplified top view and a simplified cross-sectional view of a diode device according to alternative non-limiting embodiments.
Figure 7B:
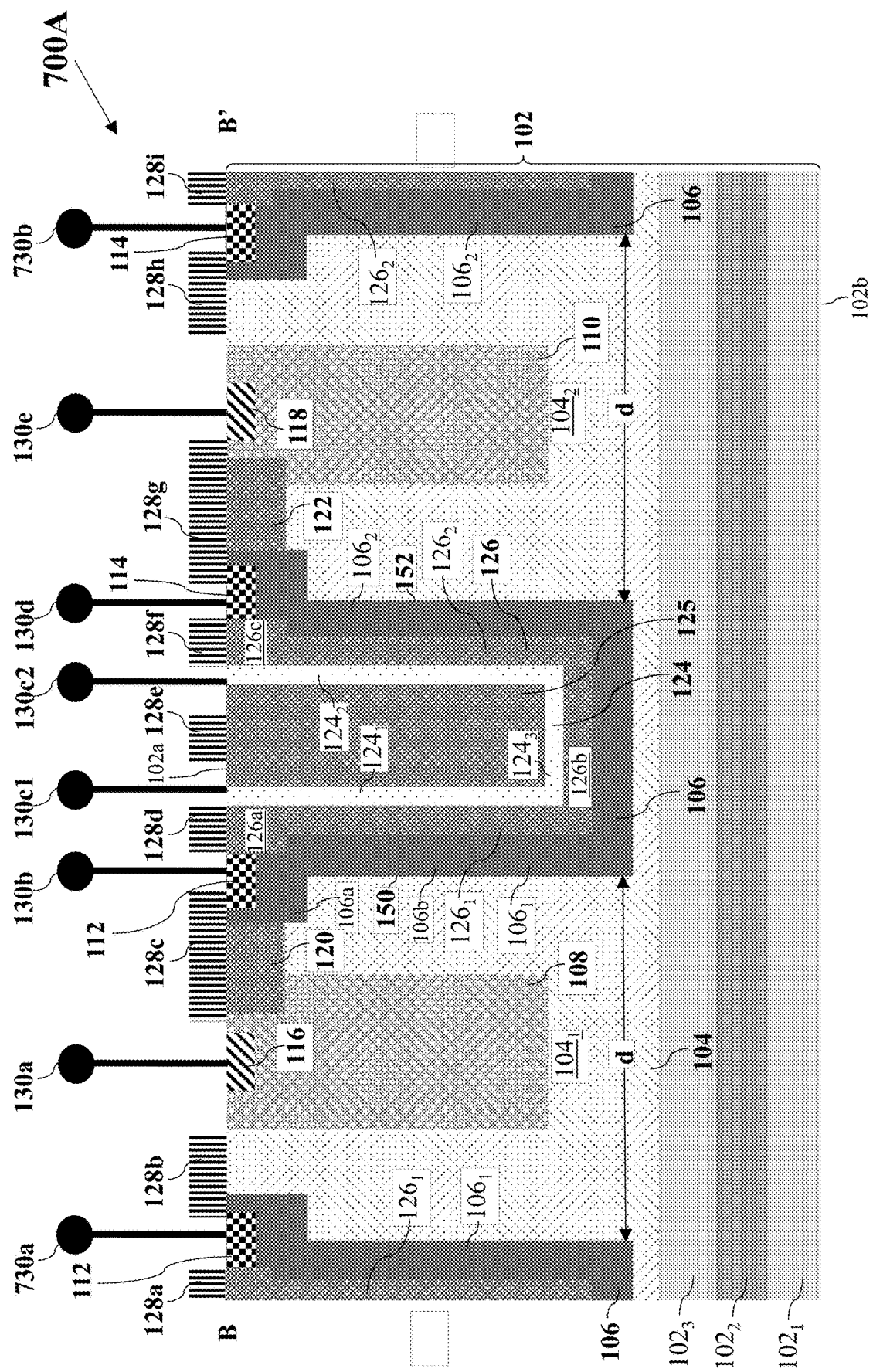

FIG. 7A shows a simplified top view of a diode structure 700 comprising a plurality of diode devices 700A, 700B according to alternative non-limiting embodiments, and FIG. 7B shows a simplified cross-sectional view of the diode device 700A along the line B-B'. The diode device 700A may be similar to the diode device 100, and thus, the common features are labelled with the same reference numerals and need not be discussed. For simplicity, the first and second isolation elements 120, 122 are not shown in FIG. 7A. Further, it is understood that although only two diode devices 700A, 700B are shown in FIG. 7A, the diode structure 700 may include fewer or more diode devices.

As shown in FIG. 7B, the semiconductor substrate 102 of the diode device 700A may be a SOI substrate. However, the semiconductor substrate 102 of the diode device 700A may instead be formed of bulk silicon.

As shown in FIGS. 7A and 7B, in each diode device 700A, 700B, the second contact region 116 and the further second contact region 118 may each include a cylindrical region 116, 118 extending into the semiconductor substrate 102. The second doped region 108, the further second doped region 110, the first contact region 112 and the further first contact region 114 may also each include a cylindrical region 108, 110, 112, 114 extending into the semiconductor substrate 102. As shown in FIGS. 7A and 7B, the second contact region 116 may be arranged within and may be approximately in the centre of the second doped region 108, and the further second contact region 118 may be arranged within and may be approximately in the centre of the further second doped region 110.

Further, the well region 104 may include first and second cylindrical regions $104_1$, $104_2$. As shown in FIG. 7B, the first and second cylindrical regions $104_1$, $104_2$ may be connected to form a continuous well region 104 within the semiconductor substrate 102. A diameter d of each cylindrical well region $104_1$, $104_2$ may range from about 4 um to about 40 um. Similarly, the first doped region 106 may include a cylindrical region $106_1$ and a second cylindrical region $106_2$. As shown in FIG. 7B, the first and second cylindrical regions $106_1$, $106_2$ may also be connected to form a continuous first doped region 106 having the first and second segments 106a, 106b similar to those described above for the diode device 100. This continuous first doped region 106 may be arranged within the well region 104 as shown in FIG. 7B.

Further, the isolation structure 124 of each diode device 700A, 700B may include a first hollow cylindrical structure $124_1$ and a second hollow cylindrical structure $124_2$ as shown in FIG. 7A. Such cylindrical structures $124_1$, $124_2$ may be referred to as nano-pillars and the diode structure 700 may be referred to as including a nano-pillar array. As shown in FIG. 7B, the first and second hollow cylindrical structures $124_1$, $124_2$ may be connected by a base 1243 to form a continuous isolation structure 124 having a trench 125 therein. The continuous isolation structure 124 may be arranged within the continuous first doped region 106.

As shown in FIG. 7A, the regions 116, 108, $104_1$, $106_1$, 112 and the first cylindrical isolation structure $124_1$ may be arranged to form a first concentric arrangement; whereas, the regions 118, 110, $104_2$, $106_2$, 114 and the second cylindrical isolation structure $124_2$ may be arranged to form a second concentric arrangement. These first and second concentric arrangements may be arranged within an oxide layer 702. As shown in FIGS. 7A and 7B, the first and second concentric arrangements may be spaced apart with the trench 125 arranged therebetween and the trench 125 may include oxide from the oxide layer 702.

Further, the first cylindrical isolation structure $124_1$ may be spaced apart from the region $106_1$ and the second cylindrical isolation structure $124_2$ may be spaced apart from the region $106_2$. Accordingly, a part of the oxide layer 702 may form first and second hollow cylindrical oxide layers $126_1$, $126_2$. The first cylindrical oxide layer $126_1$ may be arranged within the elongate hole of the first cylindrical isolation structure $124_1$ and may line a surface of the first cylindrical isolation structure $124_1$ within this hole; whereas, the second cylindrical oxide layer $126_2$ may be arranged within the elongate hole of the second cylindrical isolation structure $124_2$ and may line a surface of the second cylindrical isolation structure $124_2$ within this hole. As shown in FIG. 7B, the first and second cylindrical oxide layers $126_1$, $126_2$ may be connected to form a continuous oxide layer 126 lining a surface of the continuous isolation structure 124, where this continuous oxide layer 126 may also have first, second and third portions 126a, 126b, 126c similar to those described above with reference to the diode device 100.

The diode device 700A may also include electrodes 130a-130e arranged over the top surface 102a of the semiconductor substrate 102, except that instead of a single electrode 130c in electrical contact with the isolation structure 124, two separate electrodes 130c1, 130c2 may be in electrical contact with the isolation structure 124. The diode device 700A may also include a first additional electrode 730a and a second additional electrode 730b in electrical contact with the first contact region 112 and the further first contact region 114 respectively. Dielectric elements 128a-128i may be arranged over the top surface 102a of the semiconductor substrate 102, and an electrode 103a-130e, 730a, 730b may be arranged between each pair of adjacent dielectric elements 128a-128i.

Figure 8:
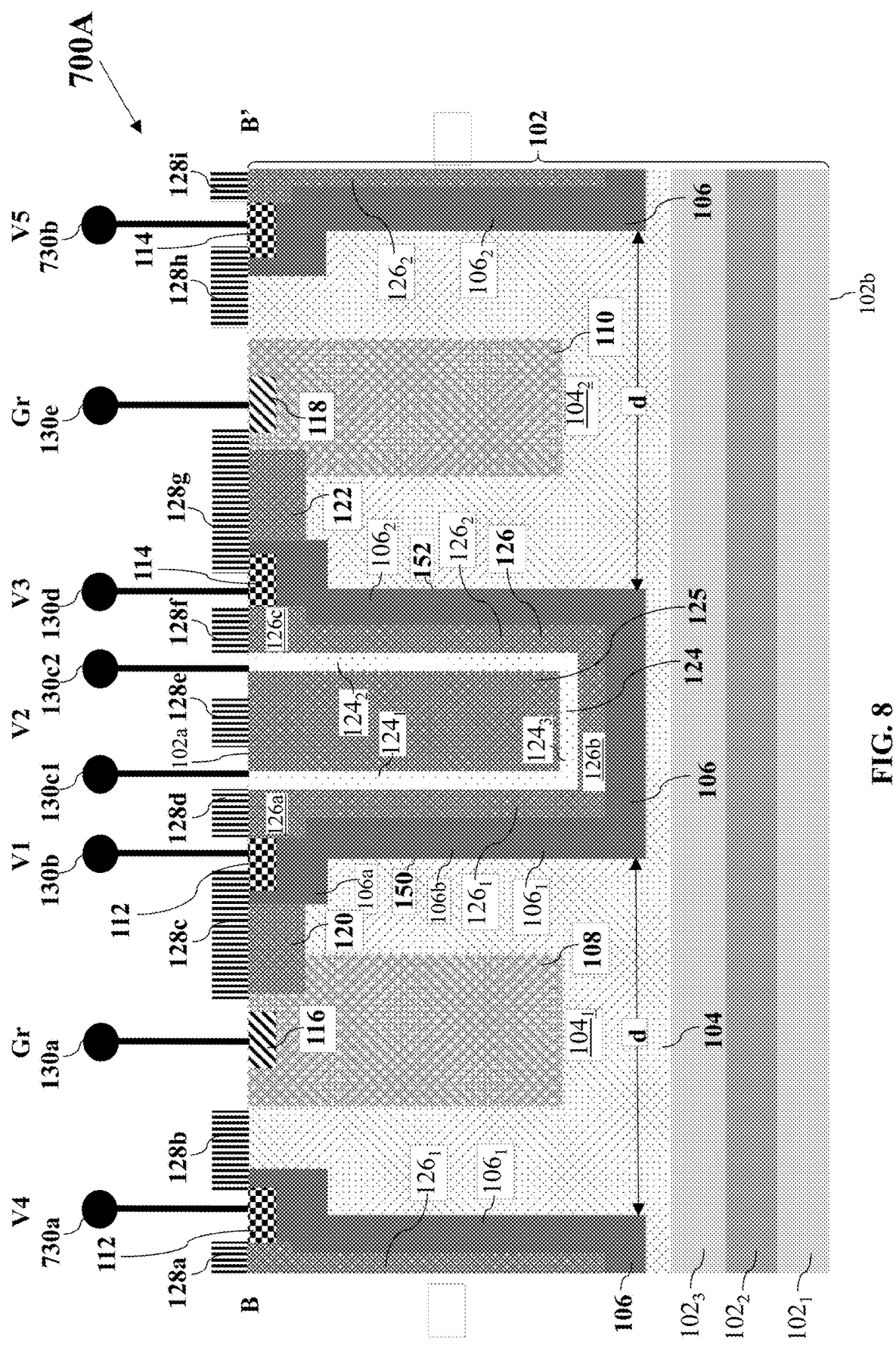
FIG. 8 shows a simplified cross-sectional view of the diode device of FIGS. 7A and 7B in use.

FIG. 8 shows the diode device 700A in use. The diode device 700A may operate with front-side illumination or back-side illumination. In use, the electrodes 130a, 130e may be connected to ground (Gr). The electrode 130b in electrical contact with the first contact region 112 may be connected to an external voltage V1, the electrodes 130c1, 130c2 in electrical contact with the isolation structure 124 may be connected to an external voltage V2 and the electrode 130d in electrical contact with the further first contact region 114 may be connected to an external voltage V3. The external voltages V1, V2, V3 may be negative voltages, where the magnitudes of the external voltages V1, V3 may be larger than the magnitude of the external voltage V2. This may thus reverse bias the first and second vertical PN junctions 150, 152. Further, the first additional electrode 730a may be connected to a first additional external voltage V4 and the second additional electrode 730b may be connected to a second additional external voltage V5. The first and second additional voltages V4, V5 may also be negative voltages, where the magnitudes of these first and second additional voltages V4, V5 may be approximately equal to the magnitudes of the external voltages V1, V3. The diode device 700A may operate in a similar manner as the diode device 100 as described above.

By using nano-pillars as the isolation structures 124, light absorption of the diode device 700A may increase. In other words, more photons may be absorbed within the depletion regions formed across the PN junctions 150, 152. Accordingly, the PDE of the diode device 700A may be higher than the PDE of the diode device 100.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A diode device comprising:
   a semiconductor substrate comprising a well region arranged therein;
   a first doped region and a second doped region arranged within the well region;
   a first contact region arranged within the first doped region, wherein a doping concentration of the first contact region is higher than a doping concentration of the first doped region, and wherein a part of the first doped region is arranged between the first contact region and the well region; and
   an isolation structure arranged within the first doped region; wherein an oxide layer lines a surface of the isolation structure,
   wherein the oxide layer comprises:
      a first portion arranged between the first contact region and the isolation structure; and
      a second portion arranged under the first portion,
      wherein the first portion extends further in a direction away from the surface of the isolation structure than the second portion,
   wherein the first doped region and the first contact region have a first conductivity type, and wherein the well region and the second doped region have a second conductivity type different from the first conductivity type.

2. The diode device of claim 1, wherein the first portion of the oxide layer contacts the first contact region and the isolation structure.

3. The diode device of claim 1, wherein the first portion of the oxide layer and the first contact region are substantially horizontally aligned along a top surface of the semiconductor substrate; and wherein the first portion of the oxide layer extends further in a direction away from the top surface of the semiconductor substrate than the first contact region.

4. The diode device of claim 1, wherein the first doped region comprises:

a first segment substantially horizontally aligned along a top surface of the semiconductor substrate; and a second segment arranged under the first segment;

wherein the first segment extends beyond the second segment in a direction away from the isolation structure.

5. The diode device of claim 1, wherein the isolation structure is a deep trench isolation structure.

6. The diode device of claim 1, wherein a part of the well region is arranged between the first doped region and the second doped region.

7. The diode device of claim 1, further comprising a second contact region of the second conductivity type arranged within the second doped region, wherein a doping concentration of the second contact region is higher than a doping concentration of the second doped region.

8. The diode device of claim 1, further comprising a further first contact region of the first conductivity type arranged within the first doped region, wherein a doping concentration of the further first contact region is higher than a doping concentration of the first doped region.

9. The diode device of claim 1, further comprising a further second doped region of the second conductivity type arranged within the well region, and a further second contact region of the second conductivity type arranged within the further second doped region, wherein the further second contact region has a higher doping concentration than the further second doped region.

10. The diode device of claim 1, further comprising an isolation element arranged horizontally between the first doped region and the second doped region.

11. The diode device of claim 10, wherein the isolation element contacts the first doped region.

12. The diode device of claim 10, wherein the isolation element extends partially into the second doped region.

13. The diode device of claim 1, wherein the semiconductor substrate comprises a silicon-on-insulator substrate.

14. The diode device of claim 1, further comprising an additional isolation structure arranged horizontally adjacent to the second doped region, wherein the second doped region is horizontally between the additional isolation structure and the first doped region.

15. The diode device of claim 14, wherein an additional oxide layer lines a surface of the additional isolation structure, wherein the additional oxide layer extends partially into the second doped region.

16. The diode device of claim 14, wherein the additional oxide layer comprises a first portion extending partially into the second doped region and a second portion arranged under the first portion, wherein a thickness of the first portion is greater than a thickness of the second portion.

17. The diode device of claim 1, wherein the isolation structure comprises a first hollow cylindrical structure and a second hollow cylindrical structure connected to form a continuous cylindrical structure having a trench therein, and wherein the trench comprises oxide.

18. The diode device of claim 1, wherein the diode device comprises an avalanche photodiode.

19. A method for forming a diode device, the method comprising:

providing a semiconductor substrate;

forming a well region within the semiconductor substrate;

forming a first doped region and a second doped region within the well region;

forming a first contact region within the first doped region, wherein a doping concentration of the first contact region is higher than a doping concentration of the first doped region, and wherein a part of the first doped region is arranged between the first contact region and the well region; and forming an isolation structure within the first doped region and an oxide layer lining a surface of the isolation structure, wherein the oxide layer comprises:

a first portion arranged between the first contact region and the isolation structure; and a second portion arranged under the first portion, wherein the first portion extends further in a direction away from the surface of the isolation structure than the second portion, wherein the first doped region and the first contact region have a first conductivity type, and wherein the well region and the second doped region have a second conductivity type different from the first conductivity type.

* * * * *